US008247881B2

(12) United States Patent
Ahn

(10) Patent No.: US 8,247,881 B2
(45) Date of Patent: Aug. 21, 2012

(54) PHOTODIODES WITH SURFACE PLASMON COUPLERS

(75) Inventor: Doyeol Ahn, Seoul (KR)

(73) Assignee: University of Seoul Industry Cooperation Foundation, Seoul (KR)

( * ) Notice: Subject to any disclaimer, the term of this patent is extended or adjusted under 35 U.S.C. 154(b) by 346 days.

(21) Appl. No.: 12/430,447

(22) Filed: Apr. 27, 2009

(65) Prior Publication Data
US 2010/0270638 A1    Oct. 28, 2010

(51) Int. Cl.
*H01L 31/18* (2006.01)
*H01L 31/0224* (2006.01)
*H01L 21/02* (2006.01)

(52) U.S. Cl. ........ 257/437; 257/448; 257/457; 257/459; 257/E31.093; 257/E31.124; 257/E31.127; 438/72

(58) Field of Classification Search .............. 257/431, 257/432, 436, 437, 448, 449, 457, 459, E31.124, 257/E31.093, E31.127; 438/57, 59, 72, 73
See application file for complete search history.

(56) References Cited

U.S. PATENT DOCUMENTS

| 4,131,488 | A | * | 12/1978 | Lesk et al. | 438/71 |
| 4,163,987 | A | * | 8/1979 | Kamath et al. | 136/262 |
| 4,227,941 | A | * | 10/1980 | Bozler et al. | 136/255 |
| 4,228,446 | A | * | 10/1980 | Kramer | 257/437 |
| 4,594,605 | A | * | 6/1986 | Kramer | 257/437 |
| 5,177,581 | A | * | 1/1993 | Kubo et al. | 257/437 |
| 5,449,943 | A | * | 9/1995 | Kasai et al. | 257/437 |
| 5,671,914 | A | * | 9/1997 | Kalkhoran et al. | 257/77 |
| 6,096,968 | A | * | 8/2000 | Schlosser et al. | 136/256 |
| 6,114,737 | A | * | 9/2000 | Tonai | 257/434 |
| 6,262,359 | B1 | * | 7/2001 | Meier et al. | 136/256 |
| 6,288,434 | B1 | * | 9/2001 | Levy | 257/437 |
| 6,545,329 | B1 | * | 4/2003 | Lannon et al. | 257/414 |
| 7,217,883 | B2 | * | 5/2007 | Munzer | 136/256 |
| 7,317,237 | B2 | * | 1/2008 | Niira et al. | 257/461 |
| 7,572,571 | B2 | * | 8/2009 | Moon | 430/290 |
| 2003/0128364 | A1 | | 7/2003 | Dickopf et al. | |
| 2005/0248829 | A1 | | 11/2005 | Sawin et al. | |
| 2008/0316490 | A1 | | 12/2008 | Yen et al. | |
| 2009/0021742 | A1 | | 1/2009 | Furusawa et al. | |
| 2009/0134486 | A1 | * | 5/2009 | Fujikata | 257/449 |
| 2010/0013040 | A1 | * | 1/2010 | Okamoto et al. | 257/432 |
| 2010/0163759 | A1 | * | 7/2010 | Castagna et al. | 250/552 |

(Continued)

FOREIGN PATENT DOCUMENTS

EP    1 424 549 A1    6/2004

(Continued)

OTHER PUBLICATIONS

Australian Patent Office; International Search Report in PCT application (PCT/KR2010/002651) which claims priority to the present application; Jul. 16, 2010.

(Continued)

*Primary Examiner* — Mary Wilczewski
(74) *Attorney, Agent, or Firm* — Workman Nydegger

(57) ABSTRACT

A device that includes a signal generating unit having a surface that can receive photons, a first metal structure located on the surface of the signal generating unit, and a second metal structure located on the surface of the signal generating unit. The second metal structure being spaced apart from the first metal structure.

23 Claims, 13 Drawing Sheets

U.S. PATENT DOCUMENTS

2010/0264505 A1* 10/2010 Bui et al. .................. 257/437

FOREIGN PATENT DOCUMENTS

| | | |
|---|---|---|
| EP | 1 837 635 A1 | 9/2007 |
| EP | 1 995 793 A1 | 11/2008 |
| JP | 2006-003149 A | 1/2006 |
| JP | 2008-175616 A | 7/2008 |
| JP | 2008-180702 A | 8/2008 |
| WO | 2004/113880 A2 | 12/2004 |
| WO | 2005/081813 A2 | 9/2005 |
| WO | 20051092037 A2 | 10/2005 |
| WO | 20071085913 A2 | 8/2007 |
| WO | 2008/030666 A2 | 3/2008 |
| WO | 20081072688 A1 | 6/2008 |

OTHER PUBLICATIONS

S.I.Bozhevolnyi et al., "Channel Plasmon-Polariton Guiding by Subwavelength Metal Grooves" Phys. Rev. Lett. 95, 046802; Jul. 22, 2005.

K. Okamoto et al., "Surface-plasmon-enhanced light emitters based on inGaN quantum wells" Nature Materials 3, 601; Sep. 2004.

A. Neogi et al., "Enhancement of spontaneous recombination rate in a quantum well by resonant surface plasmon coupling" Phys. Rev. B66, 153305 (2002).

L. Liu et al. :Novel surface plasmon waveguide for high integration Opt. Express. 13, 6645; Aug. 22, 2005.

Ricker, T., "Samsung's "world's smallest" 8.4 megapixel CMOS sensor: so long CCD?," accessed at http://www.engadget.com/2007/03/27/samsungs-worlds-smallest-8-4-megapixel-cmos-sensor-so-long/, posted on Mar. 27, 2007, 4 pages.

* cited by examiner

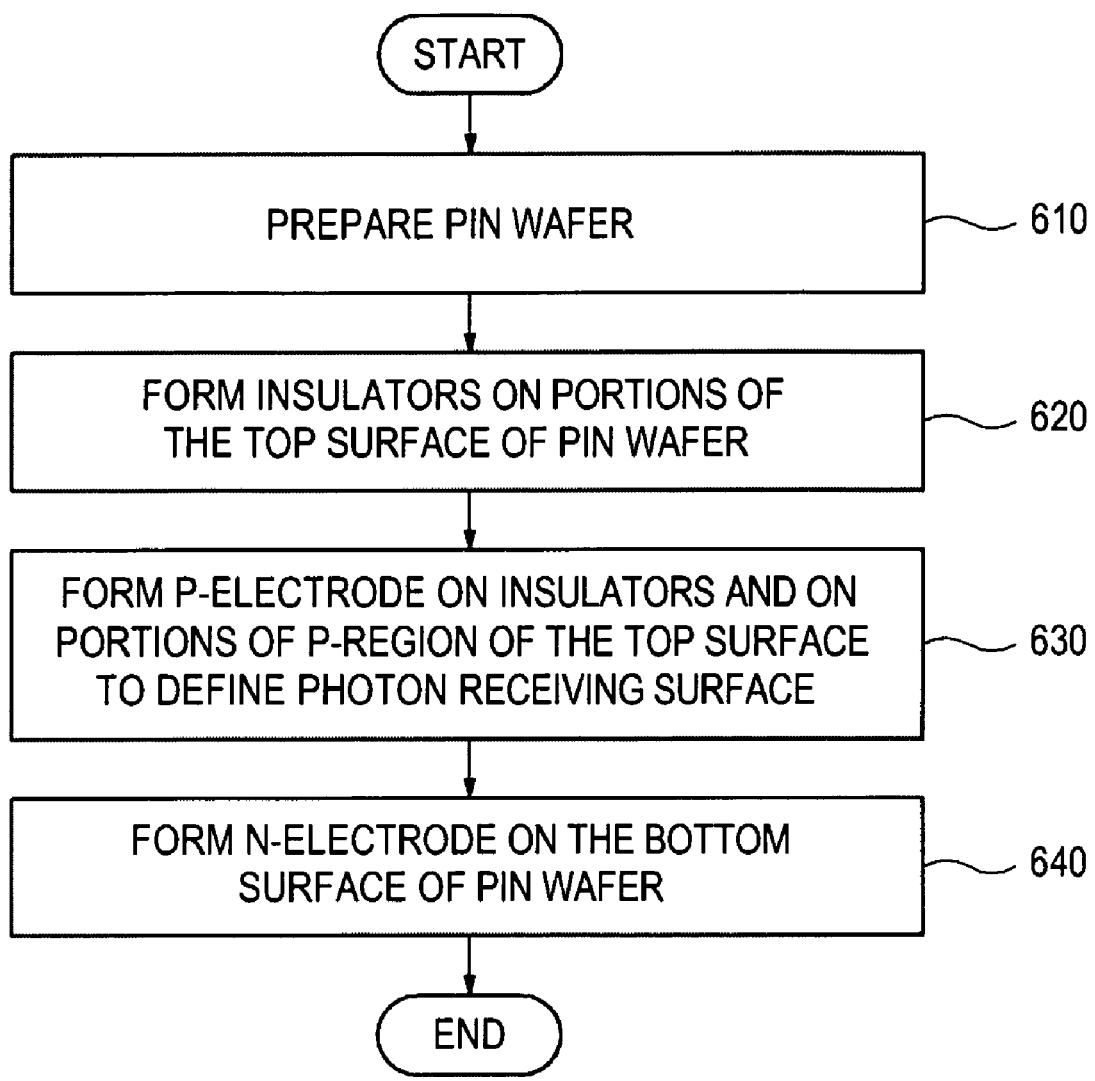

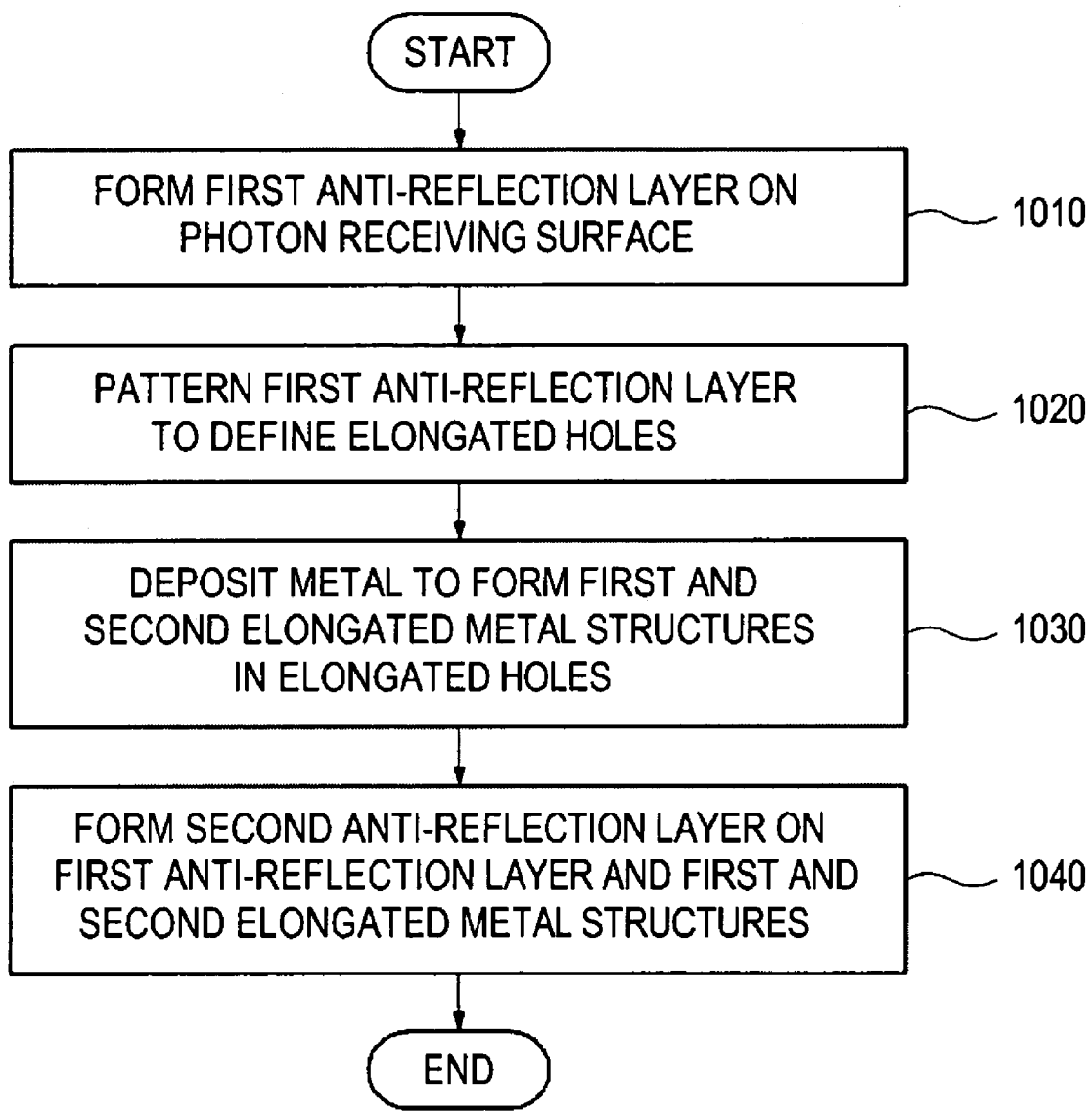

US 8,247,881 B2

PHOTODIODES WITH SURFACE PLASMON COUPLERS

TECHNICAL FIELD

The present disclosure relates generally to photodiodes and, more particularly, to photodiodes with surface plasmon couplers.

BACKGROUND

Photodiodes are commercially important for a wide range of applications. For example, a linear array of photodiodes may be used as wavelength monitors for wave length division multiplexing communication systems, spectroscopy and machine vision applications. Further, a two-dimensional array of photodiodes may be used in many applications ranging from surveillance to industrial process control. In many of the above applications, it may be preferable to use photodiodes on a smaller scale. However, simply reducing the size of photodiodes may bring serious repercussions, such as degradation of its light conversion efficiency.

SUMMARY

In one embodiment, a device may include a signal generating unit having a surface that can receive photons, a first metal structure located on the surface of the signal generating unit, and a second metal structure located on the surface of the signal generating unit. The second metal structure is spaced apart from the first metal structure.

In another embodiment a method includes forming a first metal structure on a surface of a signal generating unit wherein the surface of the signal generating unit can receive photons, and forming a second metal structure spaced apart from the first metal structure on the surface of the signal generating unit.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

FIG. 6 is a flow chart of a method for fabricating a signal generating unit in accordance with an illustrative embodiment.

FIG. 10 is a flow chart of a method for fabricating a surface plasmon coupler and an anti-reflection layer in accordance with another illustrative embodiment.

DETAILED DESCRIPTION

Figure 1A:
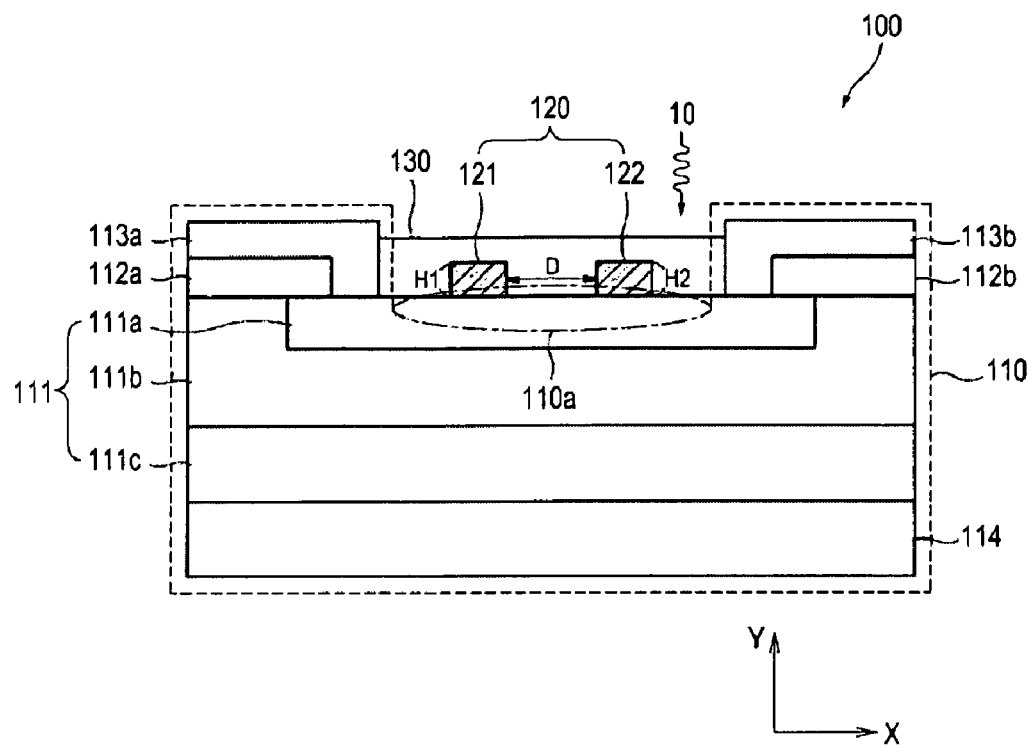
FIG. 1A is a cross-sectional view of an illustrative embodiment of a photodiode device.

In the following detailed description, reference is made to the accompanying drawings, which form a part hereof In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that aspects of the present disclosure, as generally described herein, and illustrated in the Figures, can be arranged, substituted, combined, separated, and designed in a wide variety of different configurations, all of which are explicitly contemplated herein.

Figure 1B:
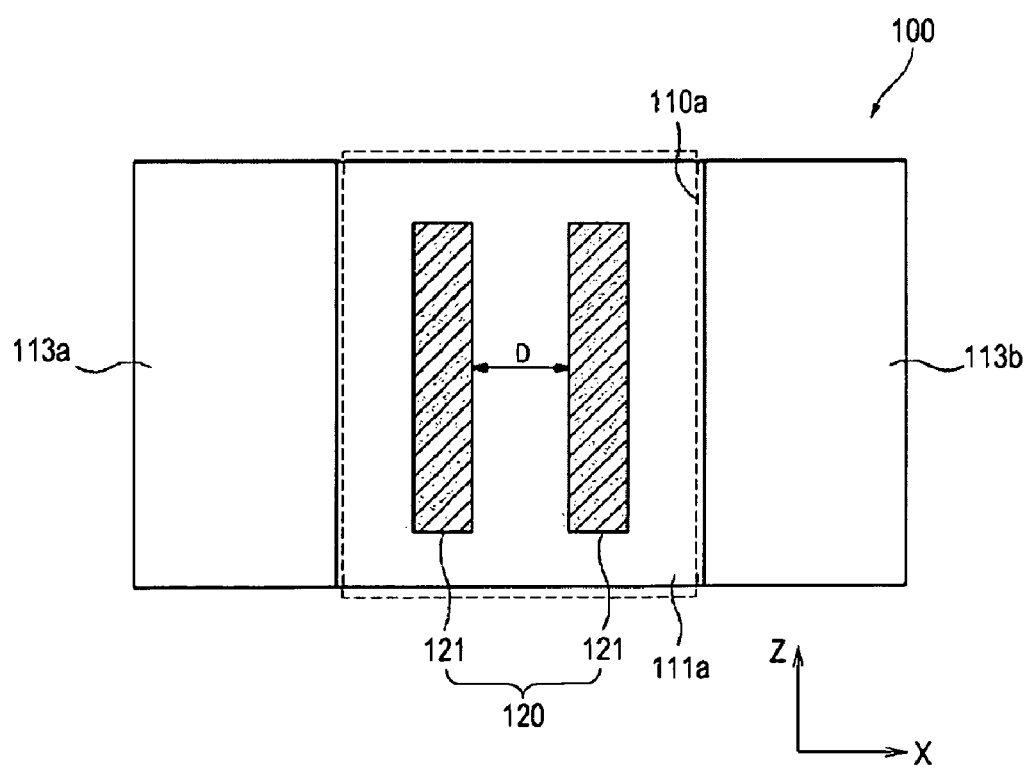
FIG. 1B is a planar-view of the photodiode device shown in FIG. 1A.

FIGS. 1A and 1B show an illustrative embodiment of a photodiode device 100. FIG. 1A is a cross-sectional view of photodiode device 100. FIG. 1B is a planar-view of photodiode device 100 shown in FIG. 1A. Referring to FIGS. 1A and 1B, photodiode device 100 may include a signal generating unit 110 and an anti-reflection layer 130 that is located on signal generating unit 110. Signal generating unit 110 may receive light or photons 10 on a photon receiving surface 110a and generate a corresponding electrical signal (e.g., a current signal), In one embodiment, signal generating unit 110 may be a pin photodiode, which includes a wafer 111 with a p-type region 111a, an intrinsic-type (i.e., i-type) region 111b, and an n-type region 111c. Wafer 111 may be made of any appropriate semiconductor material(s) known in the art, examples of which include, but are not limited to, silicon (Si), gallium arsenide (GaAs), indium arsenide (InAs), and indium gallium arsenide (InGaAs). I-type region 111b may be an un-doped or lightly-doped region doped with either n-type or p-type impurities. P-type region 111a may be doped with one or more appropriate p-type impurities (e.g., boron (B), gallium (Ga)), whereas n-type region 111c may be doped with one or more appropriate n-type impurities (e.g., phosphor (P), arsenide (As)). In one embodiment, p-type region 111a and n-type region 111c may be respectively formed on upper and lower portions of wafer 111 as shown in FIG. 1A. For example, p-type region 111a and n-type region 111c may be formed in a manner such that at least a portion of the top surface of wafer 111 corresponds to p-type region 111a, whereas the bottom surface of wafer 111 corresponds to n-type region 111c. In the particular example shown in FIGS. 1A and 1B, p-type region 111a is formed substantially in the middle of the top surface of wafer 111, so that left and right outer periphery of the top surface remain as i-type region 111b. For ease of explanation, the portions of the top surface that correspond to p-type region 111a will be referred to as "p-type top surface portion," and the portions of the top surface that corresponds to i-type region 111b will be referred to as "i-type top surface region." While the particular example illustrated in FIGS. 1A and 1B has p-type region 111a and n-type region 111c respectively formed on the upper and lower portions of wafer 111, it should be appreciated that they may be formed at different locations. For example, in another embodiment, p-type region 111a and n-type region 111c may be respectively formed on the lower and upper portions of wafer 111 so that region 111a is an n-type region and region 111c is a p-type region.

Signal generating unit 110 may further include at least one insulating layer (e.g., insulating layers 112a and 112b) on the i-type top surface portion and/or a part(s) of the p-type top surface portion. Insulating layers 112a and 112b may be made of any appropriate insulating material, examples of which include, but are not limited to, silicon oxide and silicon nitride. Also, signal generating unit 110 may include one or more p-electrodes, which may be formed on the insulating layer and on a part of the p-type top surface portion (e.g., p-electrodes 113a and 113b), and an n-electrode (e.g., an n-electrode 114), which may be formed under the bottom surface of wafer 111. In one embodiment, p-electrodes 113a and 113b and n-electrode 114 may be made of appropriate metal(s), examples of which include, but are not limited to, one or a combination of aluminum, gold, tungsten, titanium, and nitride.

As explained above, p-electrodes 113a and 113b may cover the i-type top surface portion and parts of the p-type top surface portion. Therefore, photons 10 may be received by signal generating unit 110 through the portions of the top surface of signal generating unit 110 not covered by p-electrodes 113a and 113b. For ease of explanation, the portions of the top surface exposed to the outside atmosphere or covered with a transparent material through which photons may be received will be referred to as a "photon receiving surface." An example of such photon receiving surface is illustrated in FIGS. 1A and 1B denoted by reference numeral 110a.

In one embodiment, signal generating unit 110 may further include an anti-reflection (AR) layer 130 located on photon receiving surface 110a. AR layer 130 in some embodiments has a low reflectance which reduces incident photons 10 from being reflected back to ambient air. In one embodiment, AR layer 130 may include one or more transparent thin films. For example, AR layer 130 may be composed of alternating layers, each layer having contrasting refractive indexes. AR layer 130 may be made of appropriate materials known in the art, examples of which include, but are not limited to, dielectric materials such as silicon nitride and silicon oxynitride.

When photons 10 within a prescribed frequency range are incident on photon receiving surface 110a through AR layer 130, photons 10 may collide with the atoms in wafer 111 to generate electron-hole pairs in wafer 111. The generated electrons and holes act as carriers. When a reverse-bias voltage is applied between p-electrode 113a or 113b and n-electrode 114, the pn junction formed by p-type region 111a and n-type region 111c is reverse biased to form a depletion region within i-type region 111b. The electrons and holes generated by photons 10 are respectively accelerated toward p-type region 111a and n-type region 111c by the electric field created by the reverse-bias voltage. These electrons and holes form electric current signals, which may be detected by a current detector (not shown) connected to p-electrode 113a or 113b and n-electrode 114. The current signal indicates the presence of light or photons 10 to the user or other devices (not shown) connected to photodiode device 100.

The performance of photodiode device 100 may be evaluated based on various factors, which include (a) size and (b) light conversion efficiency. Since large numbers of photodiode device 100 may be needed based on the intended application, a smaller scale photodiode device 100 may be desired. However, simply reducing the size of photodiode device 100 may unfavorably degrade its light conversion efficiency. The light conversion efficiency of a photodiode device may be evaluated based on the example equation shown below.

$$\eta = hvI/qP \quad \text{[Equation 1]}$$

where, $\eta$ denotes the light conversion efficiency, h denotes the Planck constant, v is the frequency of the photons incident on the photon receiving surface, P denotes the optical power of the photons incident on the photon receiving surface, and I denotes the current generated by the signal generating unit absorbing P.

Reducing the size of a photodiode device leads to a smaller photon receiving surface, and thus, a smaller number of photons incident on the photon receiving surface. This results in a smaller optical power being supplied to the photodiode device, thus resulting in a degradation in the light conversion efficiency of the photodiode device. For example, when a photodiode device has a photon receiving surface that is smaller than the wavelength of the incident photons, there may be a rapid drop in light conversion efficiency. Therefore, a technique to effectively collect the photons incident on a photon receiving surface of a photodiode device is required in order to realize a smaller photodiode device while maintaining or improving its light conversion efficiency.

In one embodiment, photodiode device 100 may include a surface plasmon coupler 120 on photon receiving surface 110a of signal generating unit 110. In cases where AR layer 130 is used, surface plasmon coupler 120 may be surrounded by AR layer 130. Surface plasmon coupler 120 may include at least two elongated metal structures 121 and 122 spaced apart by a prescribed distance "D." The arrangement of two elongated metal structures 121 and 122 improves the collection of the photons incident on photon receiving surface 110a by confining the electric field of incident photons 10 between two elongated metal structures 121 and 122. Better confinement of the above electric field leads to an increase in optical power provided to signal generating unit 110, and thus, improved light conversion efficiency.

Figure 2:
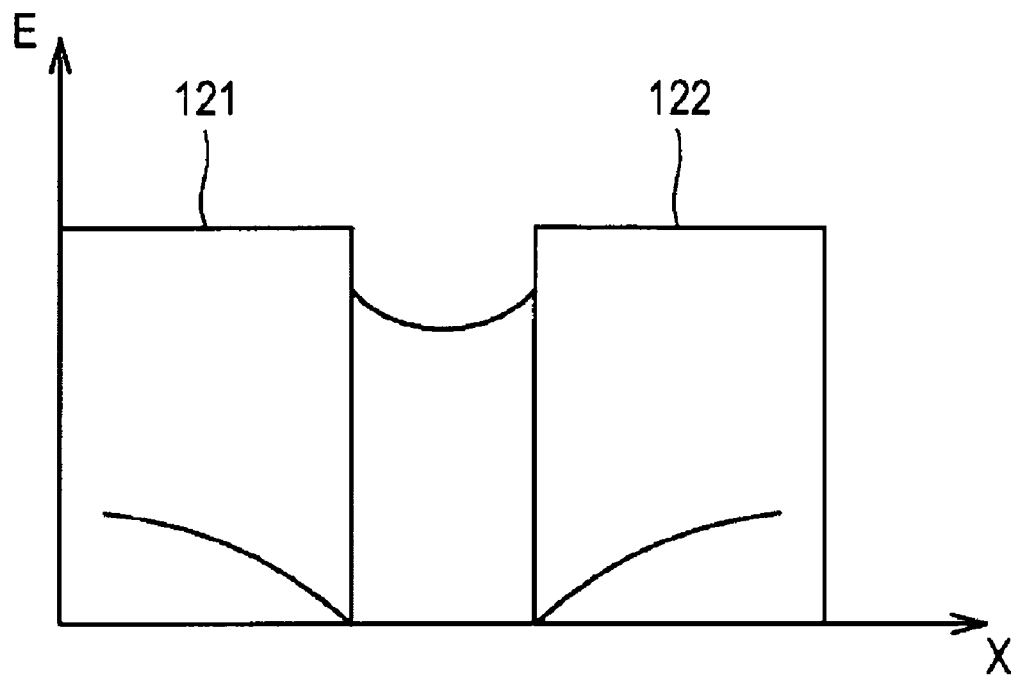
FIG. 2 illustrates the electric field in a surface plasmon coupler shown in FIG. 1.

FIG. 2 illustrates the electric field in surface plasmon coupler 120 shown in FIG. 1. As depicted, the electric fields confined between elongated metal structures 121 and 122 may be explained by Equation 2 shown below.

$$\frac{D_{x\_dielectric}}{D_{x\_metal}} = \frac{\varepsilon_{dielectric} E_{x\_dielectric}}{\varepsilon_{metal} E_{x\_metal}} = 1 \quad \text{[Equation 2]}$$

$$\therefore \frac{E_{x\_dielectric}}{E_{x\_metal}} = \frac{\varepsilon_{metal}}{\varepsilon_{dielectric}}$$

where, $D_{x\_metal}$ is an electric displacement field in elongated metal structure 121 or 122 along the x-axis, $D_{x\_dielectric}$ is an electric displacement field in a dielectric medium along the x-axis, $E_{x\_metal}$ is an electric field in elongated metal structure 121 or 122 along the x-axis, $E_{x\_dielectric}$ is an electric field in the dielectric medium along the x-axis, $\varepsilon_{metal}$ is the permittivity of elongated metal structures 121 or 122, and $\varepsilon_{dielectric}$ is the permittivity of the dielectric medium. In cases where photodiode device 100 includes AR layer 130, AR layer 130 may function or serve as the dielectric medium. In other cases where photodiode device 100 does not include AR layer 100, air may function or serve as the dielectric medium.

As can be seen from FIG. 2 and Equation 2, the electric field of the incident photons confined between elongated metal structures 121 and 122 (i.e., in the dielectric medium) is proportional to the ratio between the permittivity of elongated metal structure 121 or 122 and the permittivity of the dielectric medium. Thus, the desired confinement of the electrical field may be obtained by selecting the material(s) of appropriate permittivity for elongated metals structures 121 and 122 and/or the dielectric medium. In an embodiment, elongated metal structures 121 and 122 may be made up of one or more of various kinds of metals. The permittivity of a metal is a function of frequency, and thus, the type of metal used may depend on the frequency of the photons that are to be detected by photodiode device 100. In one embodiment, elongated metal structures 121 and 122 may include a metal with a proper permittivity for a specific spectrum (e.g. the blue spectrum). For example, elongated metal structures 121 and 122 may include a material having at least one of Ag, Al, Au, Ni, Ti, or any other appropriate metal Considering that the permittivity of a metal is generally much higher than that of a dielectric medium, the arrangement of two elongated metal structures 121 and 122 may generally enable a strong confinement of the electric field of the incident photons 10. This holds true even for the case where the distance "D" between two elongated metal structures 121 and 122 and/or the respective heights "H1" and "H2" of elongated metal structures 121 and 122 are smaller than the wavelength of incident photons 10. In one embodiment, D, H1 and/or H2 may be equal to or smaller than the wavelength of the photons that are to be detected by photodiode device 100. In another embodiment, D, H1 and/or H2 may be equal to or smaller than one quarter the wavelength of the incident photons that are to be detected by photodiode device 100. For example, in cases where the frequency of photons to be detected by photodiode device 100 is about 1 μm, surface plasmon coupler 120 may be fabricated in a manner such that D, H1 and/or H2 of elongated metal structures 121 and 122 are smaller than about 250 nm.

Photodiode device 100 described hitherto in conjunction with FIGS. 1A and 1B employs a pin photodiode as its signal generating unit 110. It should be appreciated, however, that other types of photodiodes may be employed as a signal generating unit without departing from the scope of this disclosure. Examples of such photodiodes include, but are not limited to, a pn photodiode, a schottky photodiode, and an avalanche photodiode.

Figure 3A:
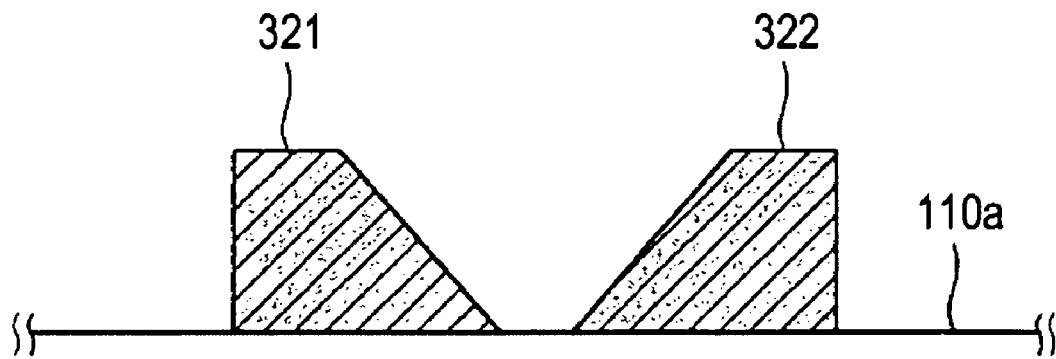
FIG. 3A illustrates a cross-sectional view of an illustrative embodiment of elongated wedge-shaped metal structures.
Figure 3B:
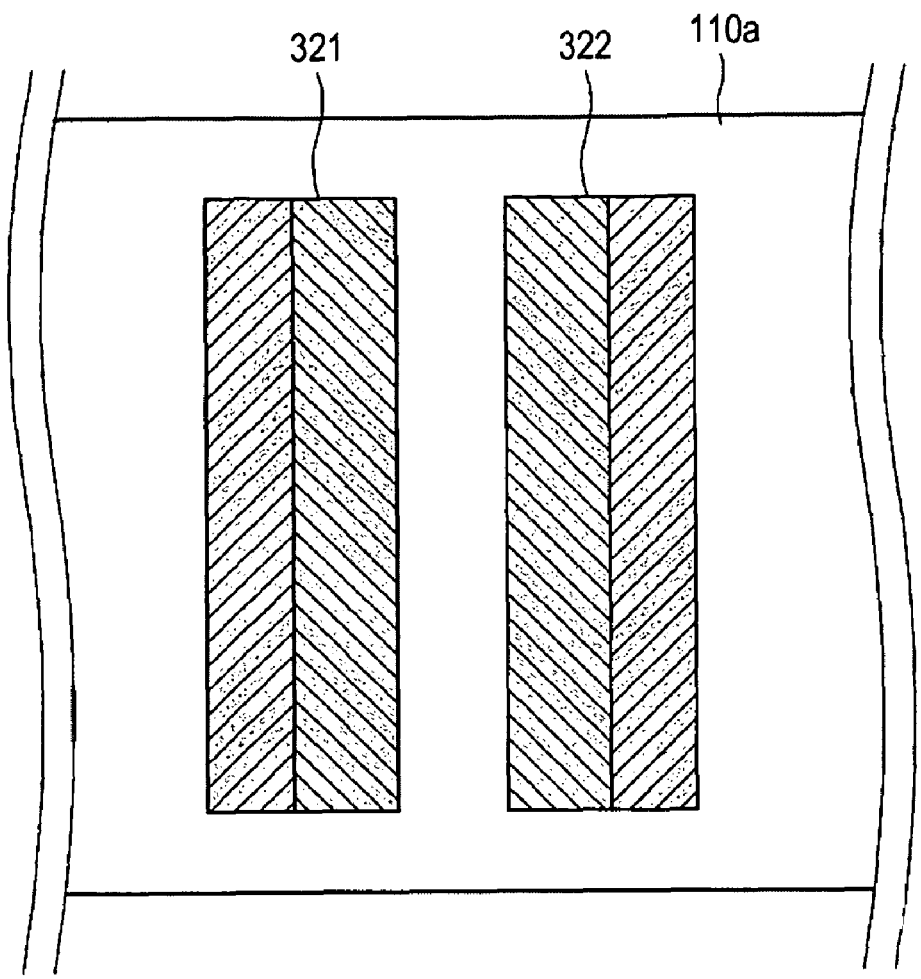
FIG. 3B illustrates a planar-view of the elongated wedge-shaped metal structures shown in FIG. 3A.
Figure 4A:
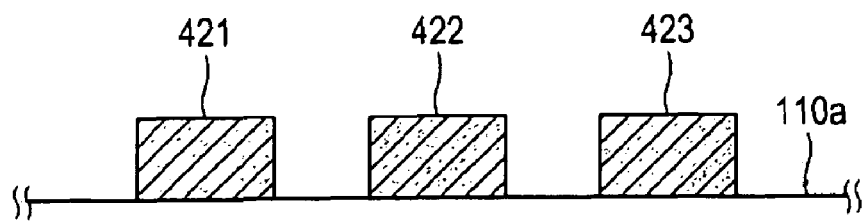
FIG. 4A illustrates a cross-sectional view of an illustrative embodiment of an array of metal structures.
Figure 4B:
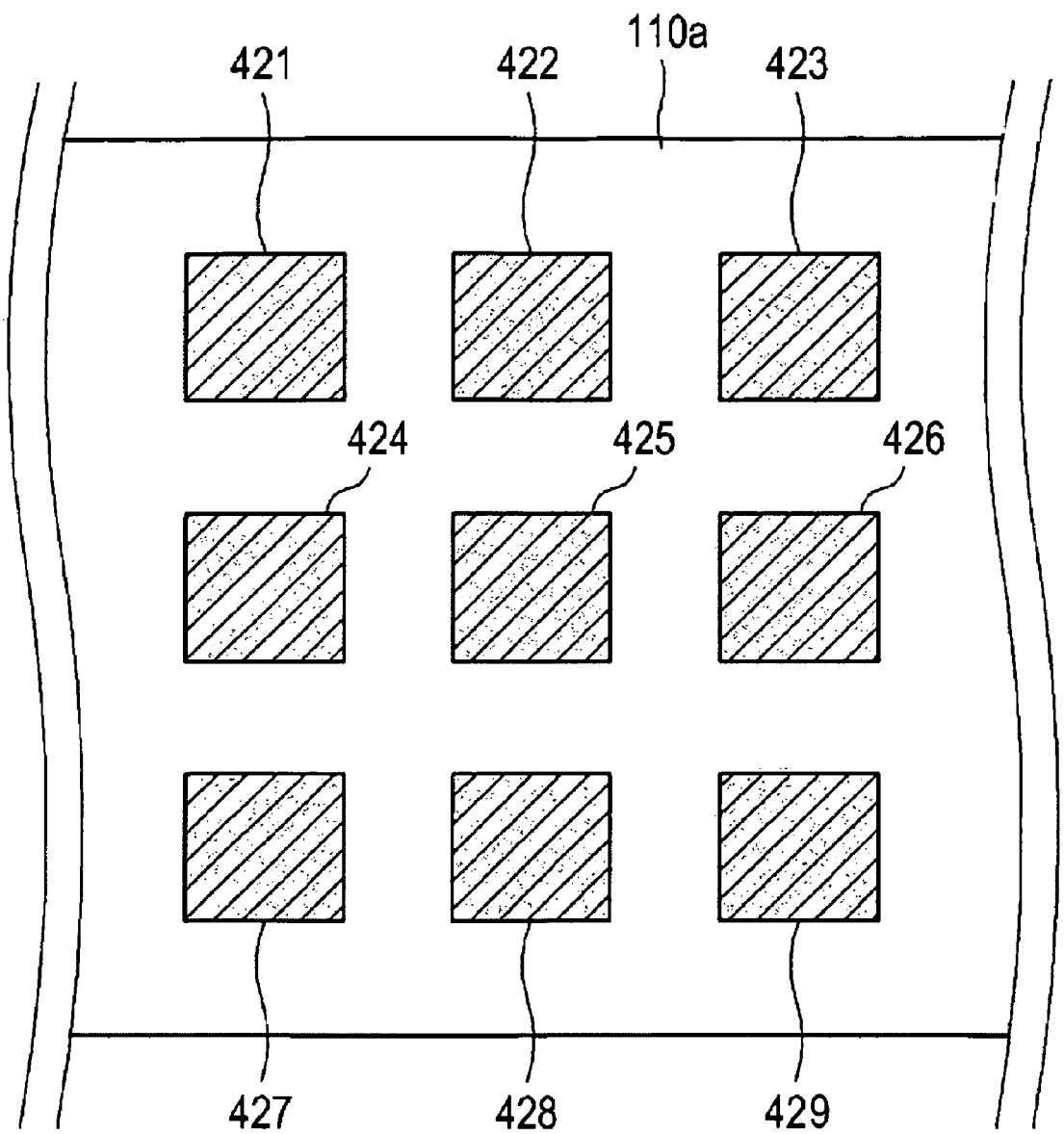
FIG. 4B illustrates a planar-view of the array of metal structures shown in FIG. 4A.

Further, while surface plasmon coupler 120 illustrated in FIGS. 1A and 1B includes two elongated metal structures 121 and 122 of a rectangular shape, a surface plasmon coupler in accordance with the present disclosure may include metal structures of a different shape that may effectively confine therebetween the electric fields of photons. For example, the surface plasmon coupler may include at least two elongated wedge-shaped metal structures. In this regard, FIG. 3A illustrates a cross-sectional view of an illustrative embodiment of such elongated wedge-shaped metal structures 321 and 322, and FIG. 3B illustrates a planar-view of elongated wedge-shaped metal structures 321 and 322 shown in FIG. 3A. Further, a surface plasmon coupler in accordance with the present disclosure may include more than two metal structures. For example, the surface plasmon coupler may include an array of metal structures. In this regard, FIG. 4A illustrates a cross-sectional view of an illustrative embodiment of an array of metal structures 421-429, and FIG. 4B illustrates a planar-view of array of metal structures 421-429 shown in FIG. 4A.

Figure 5:
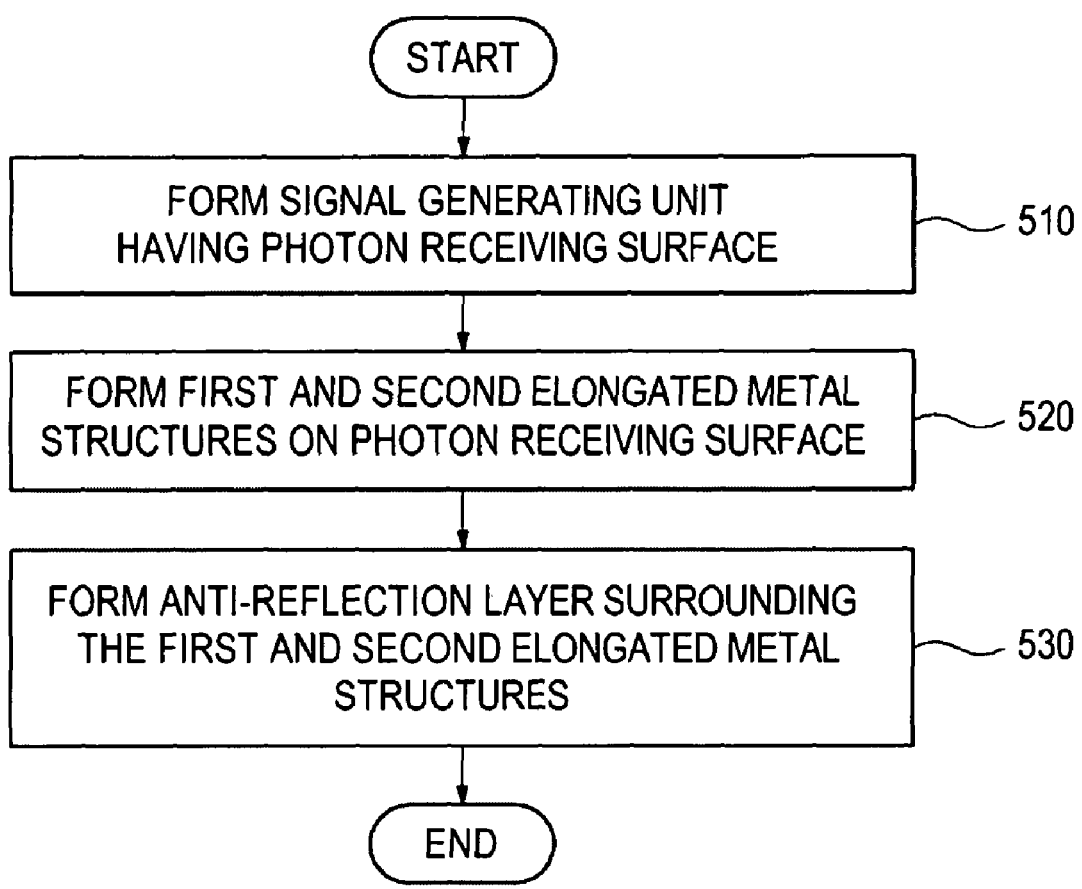
FIG. 5 is a flow chart of a method for fabricating a photodiode device in accordance with an illustrative embodiment.

The aforementioned photodiode device may be fabricated in any of a variety of ways, one of which is explained hereafter. FIG. 5 is a flow chart of a method for fabricating a photodiode device in accordance with an illustrative embodiment. Referring to FIG. 5, in block 510, a signal generating unit having a photon receiving surface is formed. The signal generating unit may be formed by performing suitable deposition, etching and/or photolithographic techniques known in the art on a pin wafer (a wafer including a p-type region, an i-type region, and an n-type region). The formed signal generating unit may be a complete signal generating unit that includes, for example, all of the components illustrated in FIGS. 1A and 1B. However, it should be appreciated that depending on the particular implementation, the formed signal generating unit may not include some of the elements, such as insulating layers 112a and 112b, p-electrodes 113a and 113b, and/or n-electrode 114 in FIGS. 1A and 1B. The above elements may be formed after one or more of the ensuing operations of the method are performed. The technical details relating to block 510 will be explained in more detail below with reference to FIG. 6 and FIGS. 7A-7D.

In block 520, first and second elongated metal structures (e.g., first and second elongated metal structures 121 and 122 in FIGS. 1A and 1B) are formed on the photon receiving surface. In block 530, an anti-reflection (AR) layer surrounding the first and second elongated metal structures (e.g., AR layer 130 in FIGS. 1A and 1B) is formed on the photon receiving surface.

The first and second metal structures and the AR layer may be formed on the photon receiving surface by using suitable deposition, etching and/or photolithographic techniques known in the art. Examples of the deposition techniques include, but are not limited to, chemical deposition techniques (e.g., chemical vapor deposition (CVD), plasma enhanced CVD (PECVD)), physical deposition techniques (e.g., physical vapor deposition (PVD) and other deposition techniques (e.g., molecular beam epitaxy (MBE)). Examples of the etching techniques include, but are not limited to, wet etching, anisotropic etching and plasma etching.

While blocks 520 and 530 are described as separate operations, it should be appreciated that depending on the particular implementation, blocks 520 and 530 may be performed concurrently. An illustrative example of blocks 520 and 530 performed separately will be described below with reference to FIG. 8 and FIGS. 9A-9C. Also, an illustrative example of blocks 520 and 530 performed concurrently will be described below with reference to FIG. 10 and FIGS. 11A-11D.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

Figure 7A:
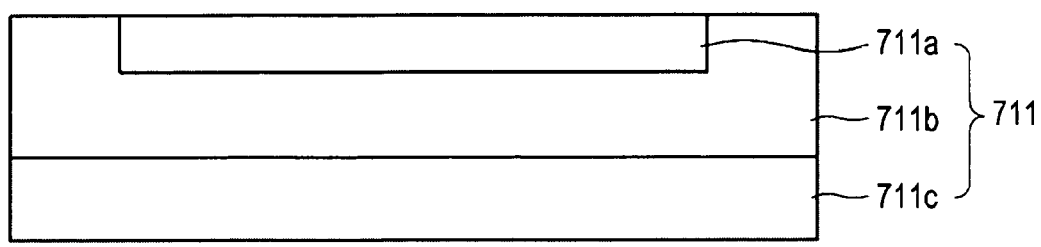
FIGS. 7A-7D are a series of diagrams illustrating the method shown in FIG. 6.

FIG. 6 is a flow chart of a method for fabricating a signal generating unit in accordance with an illustrative embodiment. FIGS. 7A-7D are a series of diagrams illustrating the method shown in FIG. 6. Referring to FIG. 6, in block 610, as shown in FIG. 7A, a pin wafer 711 including a p-type region 711a, an i-type region 711b, and an n-type region 711c is prepared. In one embodiment, pin wafer 711 may be prepared by respectively implanting p-type impurities and n-type impurities into the top and bottom surfaces of pin wafer 711.

Figure 7B:
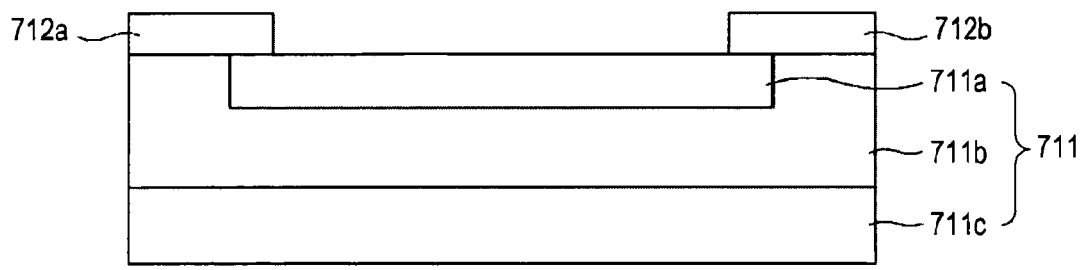
Figure 7C:
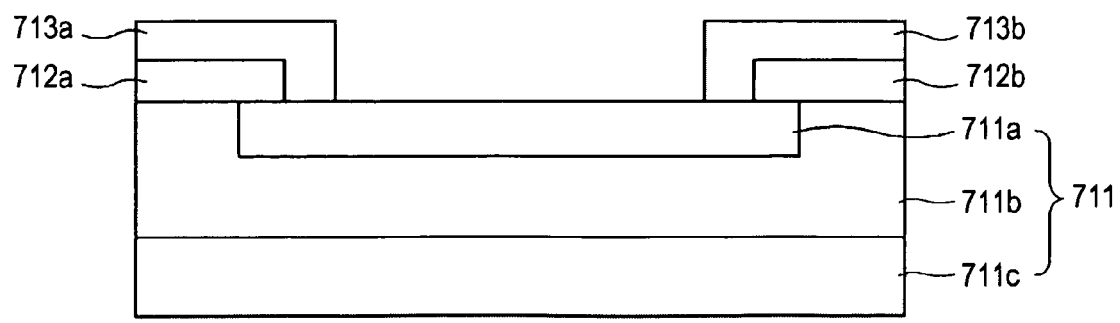
Figure 7D:
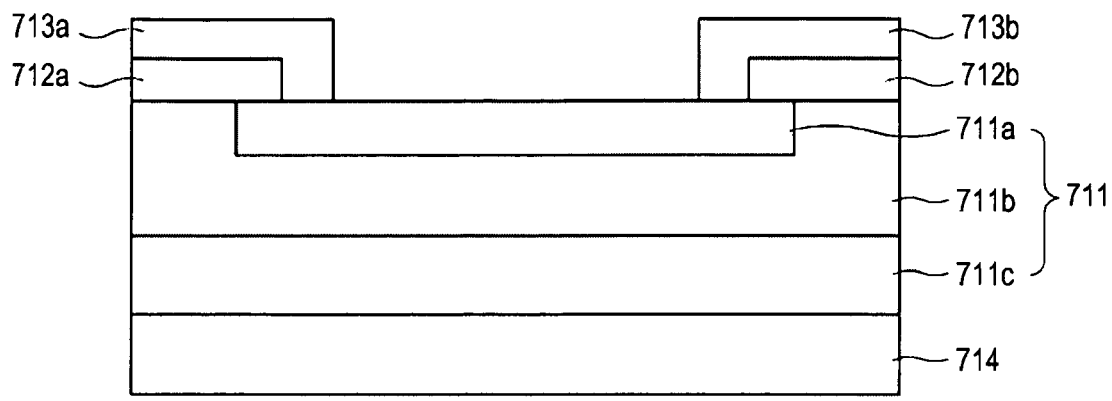

In block 620, as shown in FIG. 7B, insulators 712a and 712b are formed on portions of the top surface of pin wafer 711. In one embodiment, insulators 712a and 712b may be formed by depositing insulating material on the corresponding portions. In block 630, as shown in FIG. 7C, p-electrodes 713a and 713b are formed on insulators 712a and 712b and on portions of the top surface of p-type region 711a. The portions of the top surface not covered by insulators 712a and 712b and p-electrodes 713a and 713b are exposed and form a photon receiving surface. In block 640, as shown in FIG. 7D, n-electrode 714 is formed on the bottom surface of pin wafer 711.

Figure 8:
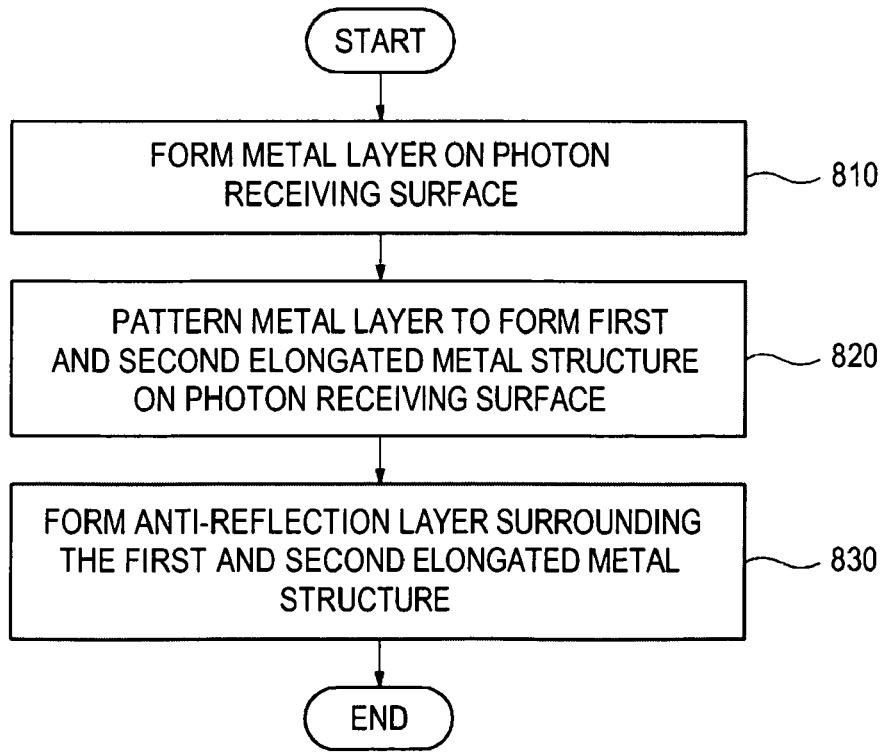
FIG. 8 is a flow chart of a method for fabricating a surface plasmon coupler and an anti-reflection layer in accordance with one illustrative embodiment.
Figure 9A:
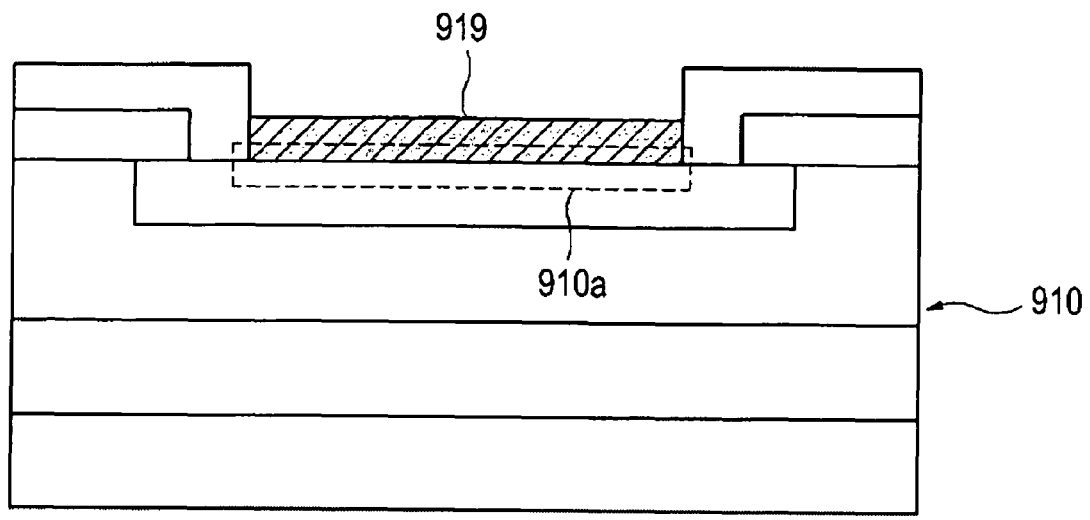
FIGS. 9A-9C are a series of diagrams illustrating the method shown in FIG. 8.
Figure 9B:
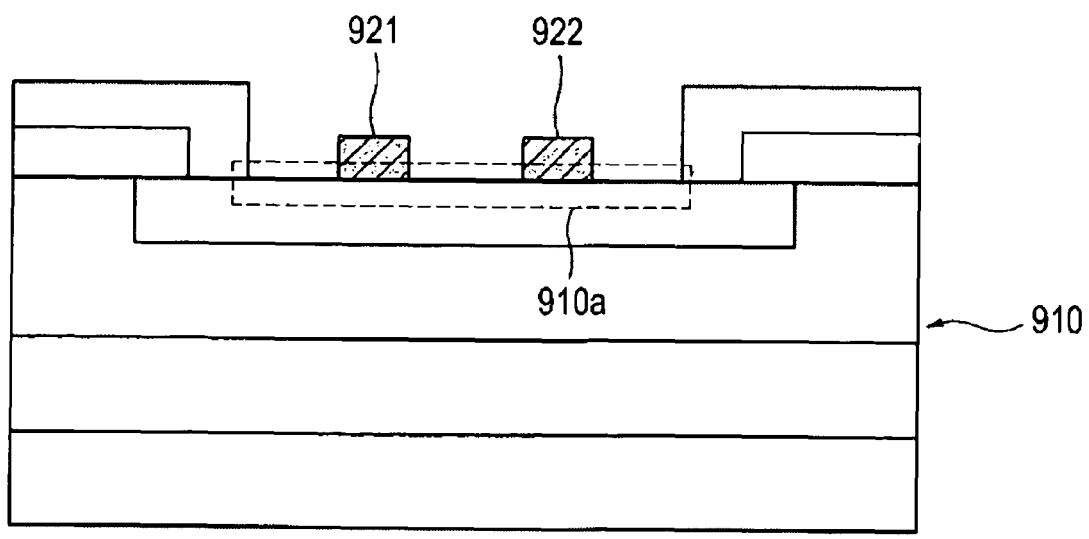
Figure 9C:
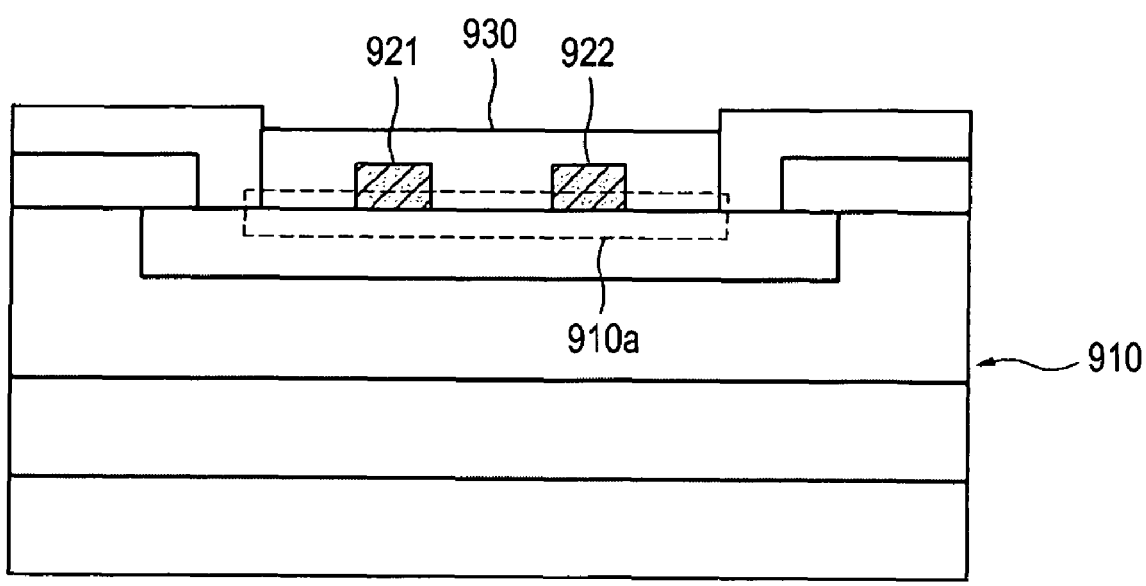

FIG. 8 is a flow chart of a method for fabricating a surface plasmon coupler and an anti-reflection layer in accordance with one illustrative embodiment. FIGS. 9A-9C are a series of diagrams illustrating the method shown in FIG. 8. Referring to FIG. 8, in block 810, as shown in FIG. 9A, a metal layer 919 is formed on a photon receiving surface 910a of a signal generating unit 910. For example, metal layer 919 may be deposited on photon receiving surface 910a by using any of a variety of suitable masking and deposition techniques known in the art. In block 820, as shown in FIG. 9B, metal layer 919 is patterned to form first and second elongated metal structures 921 and 922 on photon receiving surface 910a. For example, metal layer 919 may be patterned by using any of a variety of suitable masking and etching techniques known in the art. In block 830, as shown in FIG. 9C, an anti-reflection layer 930 surrounding first and second elongated metal structure 921 and 922 is formed on the photon receiving surface. For example, anti-reflection layer 930 may be deposited by using any of a variety of suitable masking and deposition techniques known in the art.

Figure 11A:
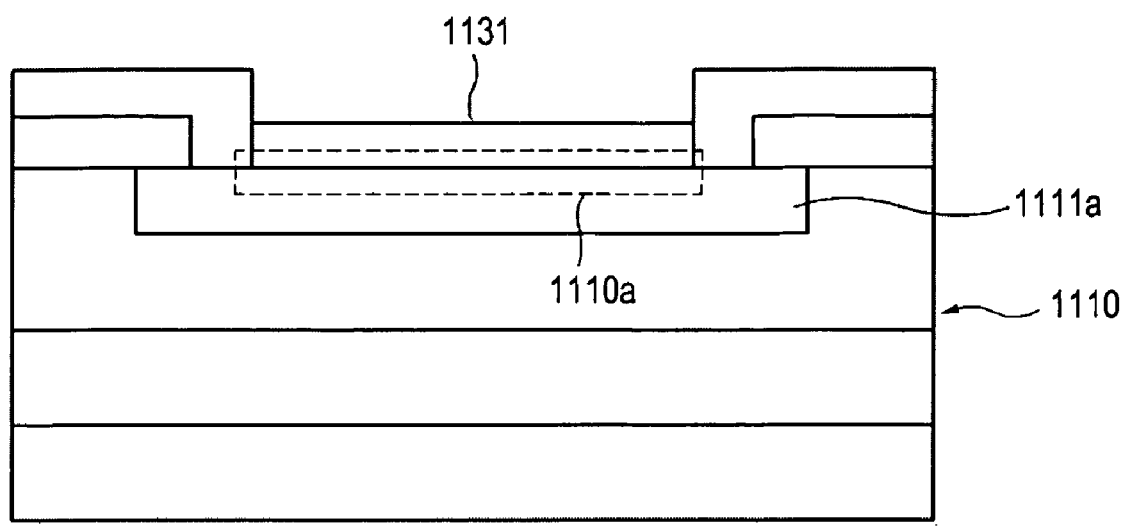
FIGS. 11A-11D are a series of diagrams illustrating the method shown in FIG. 10.
Figure 11B:
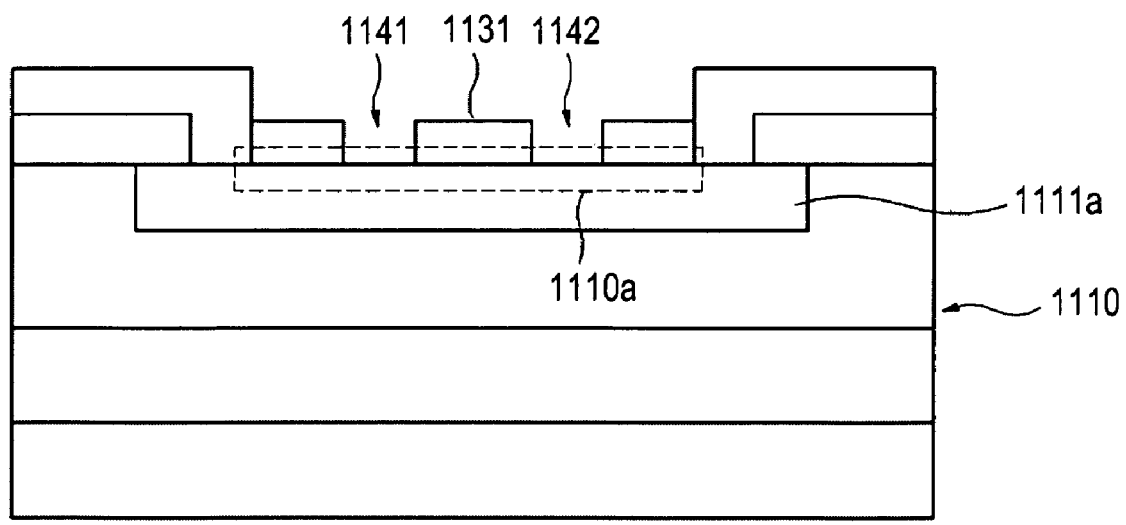
Figure 11C:
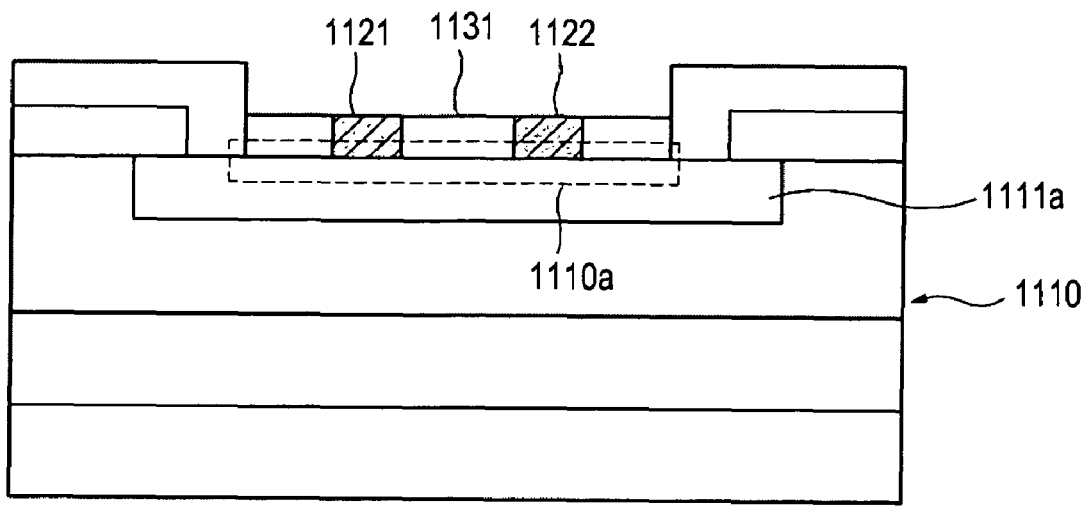
Figure 11D:
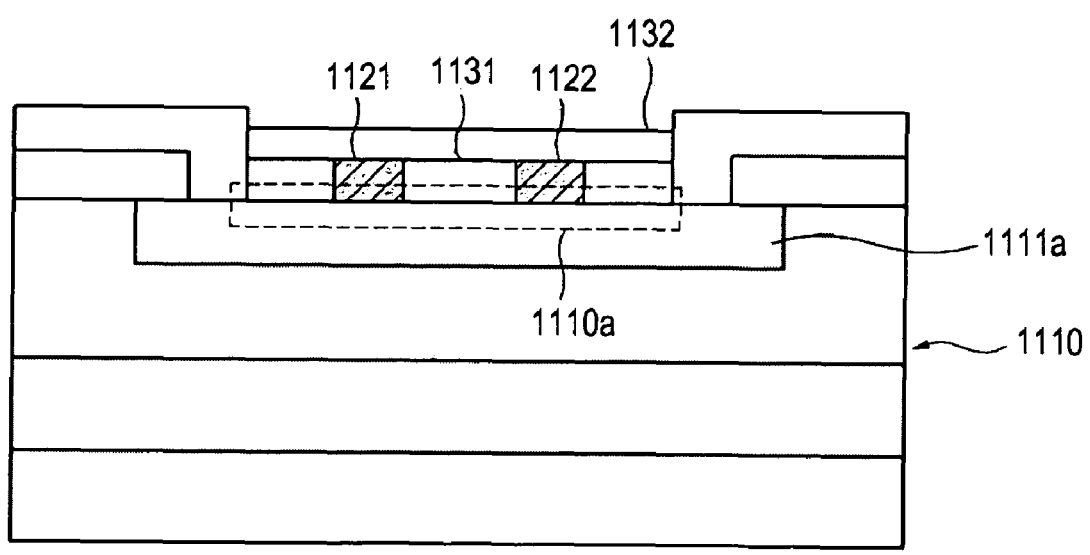

FIG. 10 is a flow chart of a method for fabricating a surface plasmon coupler and an anti-reflection layer in accordance with another illustrative embodiment. FIGS. 11A-11D are a series of diagrams illustrating the method shown in FIG. 10. Referring to FIG. 10, in block 1010, as shown in FIG. 11A, a first anti-reflection layer 1131 is formed on a photon receiving surface 1110a of a signal generating unit 1110. In one embodiment, photon receiving surface 1110a may be a portion of the top surface of p-type region 1111a of signal generating unit 1110. In block 1020, as shown in FIG. 11B, first anti-reflection layer 1131 is patterned to define therein two elongated holes 1141 and 1142. For example, first anti-reflection layer 1131 may be patterned by first forming a photo mask with patterns corresponding to two elongated holes 1141 and 1142, etching first anti-reflection layer 1131, and then removing the photo mask. In block 1030, as shown in FIG. 11C, metal is deposited into two elongated holes 1141 and 1142 to respectively form first and second elongated metal structures 1121 and 1122 in the two elongated holes 1141 and 1142. In one embodiment, elongated metal structures 1121 and 1122 may include a material having at least one of Ag, Al, Au, Ni, Ti, or any other appropriate metal. The above deposition may be performed, for example, by using any of a variety of suitable masking and deposition techniques known in the art. In block 1040, as shown in FIG. 11D, a second anti-reflection layer 1132 is formed to cover first anti-reflection layer 1131 and first and second elongated metal structures 1121 and 1122.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, will be apparent. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, it should be appreciated that these terms translate from the plural to the singular and/or from the singular to the plural as is appropriate to the context and/or application. The various singular/plural permutations may be expressly set forth herein for sake of clarity.

It should be further appreciated that, in general, terms used herein, and especially in the appended claims (e.g. bodies of the appended claims) are generally intended as "open" terms (e.g. the term "including" should be interpreted as "including but not limited to," the term "having" should be interpreted as "having at least," the term "includes" should be interpreted as "includes but is not limited to," etc.) It should be further understood that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g. "a" and/or "an" should be interpreted to mean "at least one" or "one or more"); the same holds true for the use of definite articles used to introduce claim recitations. In addition, even if a specific number of an introduced claim recitation is explicitly recited, it should be recognized that such recitation should be interpreted to mean at least the recited number (e.g. the bare recitation of "two recitations," without other modifiers, means at least two recitations, or two or more recitations). Furthermore, in those instances where a convention analogous to "at least one of A, B, and C, etc." is used, in general such a construction is intended in the sense one would understand the convention (e.g. "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one would understand the convention (e.g. "a system having at least one of A, B, or C" would include but not be limited to systems that have A alone, B alone, C alone, A and B together, A and C together, B and C together, and/or A, B, and C together, etc.). It should be further understood that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, it is recognized that the disclosure is also thereby described in terms of any individual member or subgroup of members of the Markush group.

It should be further understood, for any and all purposes, such as in terms of providing a written description, all ranges disclosed herein also encompass any and all possible subranges and combinations of subranges thereof Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. It should also be understood that all language such as "up to," "at least," and the like include the number recited and refer to ranges which can be subsequently broken down into sub-ranges as discussed above. Finally, it should also be understood that a range includes each individual member. Thus, for example, a group having 1-3 cells refers to groups having 1, 2, or 3 cells, Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. A device comprising:
    a signal generating unit having a surface that can receive photons;
    a first anti-reflection layer formed on the surface of the signal generating unit;
    a first metal structure located within a first hole region of the anti-reflection layer about the surface of the signal generating unit;
    a second metal structure located within a second hole region of the anti-reflection layer about the surface of the signal generating unit, the second metal structure being spaced apart from the first metal structure, and
    a second anti-reflection layer formed on the surface of the first anti-reflection layer and the first and second metal structures.

2. The device of claim 1, wherein the first and the second metal structures are spaced apart by a distance equal to or less than a wavelength of the photons.

3. The device of claim 1, wherein the first and the second metal structures are spaced apart by a distance equal to or less than one quarter of a wavelength of the photons.

4. The device of claim 1, wherein the first and second structures are of a thickness equal to or less than a wavelength of the photons.

5. The device of claim 1, wherein the first and the second metal structures are a thickness equal to or less than one quarter of a wavelength of the photons.

6. The device of claim 1,
    wherein the first and second metal structures are made of at least one material selected from the group consisting essentially of Ag, Al, Au, Ni, and Ti.

7. The device of claim 1,
    wherein the signal generating unit is selected from the group consisting essentially of a pn photodiode, a pin photodiode, a schottky photodiode, and an avalanche photodiode.

8. The device of claim 1, further comprising:
    an array of metal structures located on the surface of the signal generating unit.

9. The device of claim 1,
    wherein each of the first and second metal structures is an elongated metal structure.

10. The device of claim 1,
    wherein each of the first and second metal structures is a rectangular metal structure.

11. The device of claim 1,
    wherein each of the first and second metal structures is a wedge-shaped metal structure.

12. A method for fabricating a device, the method comprising:
    forming a first anti-reflection layer on a surface of a signal generating unit, wherein the surface of the signal generating unit can receive photons;
    patterning the first anti-reflection layer to define first and second holes therein, the first and second holes respectively exposing a portion of the surface of the signal generating unit;
    forming a first metal structure in the first hole;
    forming a second metal structure spaced apart from the first metal structure in the second hole; and
    forming a second anti-reflection layer on the first and second metal structures and the first anti-reflection layer.

13. The method of claim 12, wherein forming first and second metal structures comprises:
    forming a metal layer on the surface of the signal generating unit; and
    patterning the metal layer to form the first and second metal structures.

14. The method of claim 12, further comprising:
    forming an anti-reflection layer surrounding the first and second metal structures.

15. The method of claim 12, wherein the first and second metal structures are spaced apart by a distance equal to or less than a wavelength of the photons.

16. The method of claim 12, wherein the first and second metal structures are spaced apart by a distance equal to or less than a quarter of a wavelength of the photons.

17. The method of claim 12, wherein the first and second metal structures are of a thickness equal to or less than a wavelength of the photons.

18. The method of claim 12, wherein the first and second metal structures are of a thickness equal to or less than one quarter of a wavelength of the photons.

19. The method of claim 12,
    wherein the first and second metal structures are made of a material selected form the group consisting essentially of Ag, Al, Au, Ni, and Ti.

20. The method of claim 12, wherein forming the first and second metal structures comprises:
    forming an array of metal structures located on the surface of the signal generating unit, the array of metal structures including the first and second metal structures.

21. The method of claim 12, wherein the first and second metal structures are each an elongated metal structure.

22. The method of claim 12, wherein the first and second metal structures are each a rectangular metal structure.

23. The method of claim 12, wherein the first and second metal structures are each a wedge-shaped metal structure.

* * * * *

UNITED STATES PATENT AND TRADEMARK OFFICE
CERTIFICATE OF CORRECTION

| | | |
|---|---|---|
| PATENT NO. | : 8,247,881 B2 | Page 1 of 1 |
| APPLICATION NO. | : 12/430447 | |
| DATED | : August 21, 2012 | |
| INVENTOR(S) | : Ahn | |

It is certified that error appears in the above-identified patent and that said Letters Patent is hereby corrected as shown below:

On Page 2, in Item (56), under "FOREIGN PATENT DOCUMENTS", in Column 1, Line 8, delete "20051092037" and insert -- 2005/092037 --, therefor.

On Page 2, in Item (56), under "FOREIGN PATENT DOCUMENTS", in Column 1, Line 9, delete "20071085913" and insert -- 2007/085913 --, therefor.

On Page 2, in Item (56), under "FOREIGN PATENT DOCUMENTS", in Column 1, Line 11, delete "20081072688" and insert -- 2008/072688 --, therefor.

IN THE SPECIFICATIONS:

In Column 2, Line 5, delete "FIG. 8," and insert -- FIG. 8. --, therefor.

In Column 2, Line 15, delete "hereof" and insert -- hereof. --, therefor.

In Column 2, Line 36, delete "signal)," and insert -- signal). --, therefor.

In Column 5, Line 14, delete "metal" and insert -- metal. --, therefor.

In Column 8, Line 67, delete "thereof" and insert -- thereof. --, therefor.

In Column 9, Line 12, delete "3 cells," and insert -- 3 cells. --, therefor.

IN THE CLAIMS:

In Column 9, Line 34, in Claim 1, delete "structure," and insert -- structure; --, therefor.

Signed and Sealed this
Twenty-seventh Day of November, 2012

David J. Kappos
*Director of the United States Patent and Trademark Office*